United States Patent [19]
Champetier et al.

[11] Patent Number: 5,997,175
[45] Date of Patent: Dec. 7, 1999

[54] METHOD FOR DETERMINING THE TEMPERATURE OF A SEMI-TRANSPARENT RADIATING BODY

[75] Inventors: Robert J. Champetier, Scotts Valley, Calif.; David Egozi, Kiriat Tivon, Israel

[73] Assignee: Steag RTP Systems, Inc., San Jose, Calif.

[21] Appl. No.: 09/359,219

[22] Filed: Jul. 22, 1999

Related U.S. Application Data

[62] Division of application No. 08/899,865, Jul. 24, 1997.

[51] Int. Cl.$^6$ .............................. G01J 5/00; H05B 1/02; A21B 2/00; G21K 1/06
[52] U.S. Cl. ..................... 374/126; 374/130; 374/131; 219/405; 392/416; 250/492.22
[58] Field of Search ..................................... 374/126, 130, 374/131; 156/345; 118/712, 713, 725, 50.1, 724; 204/298.03, 298.32; 219/405, 411, 390; 392/411, 416, 422; 250/492.2, 492.22

[56] References Cited

U.S. PATENT DOCUMENTS

| | | | |
|---|---|---|---|
| 4,919,542 | 4/1990 | Nulman et al. | 374/9 |
| 4,979,133 | 12/1990 | Arima et al. | 702/134 |
| 5,114,242 | 5/1992 | Gat et al. | 374/128 |
| 5,154,512 | 10/1992 | Schietinger et al. | 374/9 |
| 5,165,796 | 11/1992 | Gat et al. | 374/128 |
| 5,188,458 | 2/1993 | Thompson et al. | 374/121 |
| 5,226,732 | 7/1993 | Nakos et al. | 374/133 |
| 5,249,142 | 9/1993 | Shirakawa et al. | 702/135 |
| 5,255,286 | 10/1993 | Moslehi et al. | 374/121 |
| 5,271,084 | 12/1993 | Vandenabeele et al. | 392/416 |
| 5,305,416 | 4/1994 | Fiory | 392/416 |
| 5,308,161 | 5/1994 | Stein | 374/5 |
| 5,442,727 | 8/1995 | Fiory | 392/416 |
| 5,443,315 | 8/1995 | Lee et al. | 374/126 |
| 5,444,815 | 8/1995 | Lee et al. | 392/416 |
| 5,467,220 | 11/1995 | Xu | 359/350 |
| 5,624,590 | 4/1997 | Fiory | 219/390 |
| 5,628,564 | 5/1997 | Nenyei et al. | 374/121 |
| 5,660,472 | 8/1997 | Peuse et al. | 374/128 |
| 5,738,440 | 4/1998 | O'Neill et al. | 374/9 |
| 5,874,711 | 2/1999 | Champetier et al. | 219/497 |

FOREIGN PATENT DOCUMENTS

0612862A1  8/1994  European Pat. Off. ............... 374/126

OTHER PUBLICATIONS

James F. Schooley, "Temperature, Its Measurement and Control in Science and Industry", vol. 6, pp. 923–927, American Institute of Physics, New York, 1992.

James F. Schooley, "Temperature, Its Measurement and Control in Science and Industry", vol. 6, pp. 933–938, American Institute of Physics, New York, 1992.

(List continued on next page.)

*Primary Examiner*—Diego Gutierrez
*Assistant Examiner*—Stanley J. Pruchnic, Jr.
*Attorney, Agent, or Firm*—Dority & Manning, P.A.

[57] ABSTRACT

The present invention is generally directed to a system and process for accurately determining the temperature of an object, such as a semi-conductive wafer, by sampling from the object radiation being emitted at a particular wavelength. In one embodiment, a single reflective device is placed adjacent to the radiating object. The reflective device includes areas of high reflectivity and areas of low reflectivity. The radiation being emitted by the object is sampled within both locations generating two different sets of radiation measurements. The measurements are then analyzed and a correction factor is computed based on the optical characteristics of the reflective device and the optical characteristics of the wafer. The correction factor is then used to more accurately determine the temperature of the wafer. In an alternative embodiment, if the radiating body is semi-transparent, a reflective device is placed on each side of the object, which compensates for the transparency of the object.

8 Claims, 5 Drawing Sheets

OTHER PUBLICATIONS

James F. Schooley, "Temperature, Its Measurement and Control in Science and Industry", vol. 6, pp. 877–882, American Institute of Physics, New York, 1992.

James F. Schooley, "Temperature, Its Measurement and Control in Science and Industry", vol. 6, pp. 787–789, American Institute of Physics, New York, 1992.

James F. Schooley, "Temperature, Its Measurement and Control in Science and Industry", vol. 6, pp. 843–847, American Institute of Physics, New York, 1992.

METHOD FOR DETERMINING THE TEMPERATURE OF A SEMI-TRANSPARENT RADIATING BODY

RELATED APPLICATIONS

This application is a divisional of prior application Ser. No. 08/899,865 filed on Jul. 24, 1997.

FIELD OF THE INVENTION

The present invention is generally directed to a method and to an apparatus for measuring the temperature of a radiating body. More particularly, the present invention is directed to a method and apparatus for determining the temperature of a semiconductor wafer by reflecting thermal radiation being emitted by a surface of the wafer and then sensing the reflected radiation at a plurality of locations. Specifically, the reflected radiation emitted by the surface is sampled at a plurality of locations where the amount of reflectivity has been varied.

BACKGROUND OF THE INVENTION

The accurate measurement of surface temperatures of hot objects is of concern in many industrial and scientific processes. For instance, temperatures must be accurately measured during the processing and melting of metals and glasses, during the heat treatment of semiconductors, and during the fabrication of circuit chips. In particular, the accurate determination of the temperature of semiconductor wafers is especially needed during rapid thermal processing of the wafers, during rapid thermal oxidation, or during other processes which modify or add thin chemical films or coatings to the surface of the wafers. For these critical semiconductor fabrication processes, it is essential that the temperature be known within a few degrees over a range which may extend from less than 200° C. to over 1,100° C.

In the past, the temperature of hot objects was determined either using (1) contact methods or (2) non-contact methods. For instance, during contact methods, the hot object is contacted with a sensor such as a thermocouple that is in turn connected to a temperature meter, which indicates the temperature of the object. Conventional non-contact methods of determining temperature, on the other hand, include using a light sensor such as an optical pyrometer that senses the thermal radiation being emitted by the object at a particular wavelength of light. Once the thermal radiation being emitted by the object is known, the temperature of the object can be estimated.

When processing semiconductor materials for use in the electronics industry, it is far preferable to use non-contact methods to measure the temperature of the wafers. For instance, one advantage of non-contact methods is that the wafer can be more easily rotated during the heating process for more uniformly heating the surface of the wafer. Rotating the wafer also promotes more uniform contact between the flow of processing gases and the wafer. Besides being able to rotate the wafers, another advantage to using non-contact methods is that, since no temperature gauges need be attached to the wafer, the wafers can be processed much more quickly saving precious time during semiconductor fabrication.

For all of the high temperature wafer processes of current and foreseeable interest, one of the more important requirements is that the true temperature of the wafer be determined with high accuracy, repeatability and speed. The ability to accurately measure the temperature of a wafer has a direct payoff in the quality and size of the manufactured semiconductor devices. For instance, the smallest feature size required for a given semiconductor device limits the computing speed of the finished microchip. The feature size in turn is linked to the ability to measure and control the temperature of the device during processing. Thus, there is increasing pressure within the semiconductor industry to develop more accurate temperature measurement and control systems.

In this regard, the chief disadvantage of conventional non-contact optical pyrometry systems for determining temperature is that the systems measure an apparent temperature rather than the true temperature of the wafer. In particular, a real surface emits radiation less efficiently than an ideal or perfect blackbody. Through theory and calculation, once the emitted radiation of a blackbody is known, the temperature of the blackbody can be calculated. A real body, however, such as a wafer, emits only a fraction of the radiation that would be emitted by a blackbody at the same temperature. This fraction is defined as the emissivity of the real object. Thus, when sensing the radiation being emitted by a real body, a pyrometer generally indicates an apparent temperature that is lower than the true temperature of the object.

Thus, in order to measure the true temperature of a real body using a pyrometer, the indicated temperature must be corrected to account for the emissivity. Unfortunately, the emissivity of a real body is generally unknown and is very difficult to measure accurately. Further, the emissivity of semiconductor wafers varies from wafer to wafer. The emissivity is a property of the surface and depends on several parameters, such as the chemical composition of the wafer, the thickness of the wafer, the surface roughness of the wafer, and the wavelength at which the pyrometer operates.

In the past, others have attempted to approximate the emissivity of a semiconductor wafer or to otherwise minimize its impact on temperature measurements using a pyrometer. For instance, one method for approximating the temperature of a silicon wafer using a pyrometer is to first determine the emissivity of the wafer or of a similarly constructed wafer using a temperature thermocouple in a separate process. This method, however, is not efficient. Further, it has been found that the emissivity of silicon wafers, even if they are similarly constructed, can vary widely from wafer to wafer.

Besides attempting to determine the emissivity of a wafer, other methods attempt to diminish the effect of not knowing the emissivity by using emissivity enhancement techniques. During these techniques, the object is to artificially increase the emissivity of the wafer to a value very close to unity which causes the wafer to simulate a blackbody allowing for more accurate temperature readings. For instance, one known emissity enhancement technique is to place a highly reflective sheet parallel to the semiconductor wafer as disclosed in a published European Patent Application having Publication No. 0612862 entitled: "Measuring Wafer Temperatures" by Gronet et al. and in U.S. Pat. No. 5,226,732 to Nakos et al. which are both incorporated herein by reference.

By placing a reflective sheet next to the wafer, the radiation emitted by the wafer reflects multiple times. The multiple reflections between the wafer and the reflective sheet cause the radiation between the two surfaces to add up and approximate the radiation of a perfect blackbody at the temperature of the wafer. This has the effect of enhancing the emissivity of the wafer to a value close to unity, allowing for more accurate temperature measurements.

For instance, according to Planck's law the radiation emitted by a blackbody at a particular wavelength ($\lambda$) and temperature (T) is as follows:

$$R_{bb} = \left(\frac{C_1}{\lambda^5}\right)\left(\frac{1}{e^{\frac{c_2}{\lambda T}} - 1}\right) \quad (1)$$

wherein $C_1$ and $C_2$ are well known constants. The radiation emitted by a real surface, such as a wafer, with an emissivity (E), on the other hand, is as follows:

$$R_w = ER_{bb} \quad (2)$$

When a reflective sheet is placed adjacent to the wafer, at a distance between the reflective sheet and the wafer which is vanishingly small, an infinite series of rays are created which have increasing numbers of reflections. A pyrometer sensing the multiple reflections would measure a total radiation emitted by the wafer as follows:

$$R_w = ER_{bb}[1 + \rho_r\rho_w + (\rho_r\rho_w)^2 \ldots] \quad (3)$$

wherein $\rho_r$ is the reflectivity of the reflective sheet and $\rho_w$ is the reflectivity of the wafer.

Because the geometric series contained in the brackets above simplifies to $1/(1-\rho_r \rho_w)$ and because, according to Kirchhoff's law $E = 1 - \rho_w$, the radiation emitted by the wafer can be stated as follows:

$$R_w = R_{bb}\left(\frac{1 - \rho_w}{1 - \rho_r\rho_w}\right) \quad (4)$$

Finally, if the reflectivity of the reflective sheet ($\rho_r$) is nearly 100%, i.e., 1, then the above equation reduces to $$R_w = R_{bb} \quad (5)$$

However, if the distance between the wafer and the reflective sheet is increased to several millimeters, as can be necessary in a practical system, the value of the enhanced radiation measured by the pyrometer as described above, is still dependent on the emissivity of the wafer's surface and on the reflectivity of the reflective sheet.

Further, at lower temperatures, such as lower than 700° C., semiconductor wafers can be partially transparent to thermal radiation at various different wavelengths. The extent of transparency generally depends on the composition of the wafer and on the temperature of the wafer, typically increasing in transparency as the temperature is decreased. When the wafers are partially transparent, thermal radiation that is reflected off the reflective sheet does not reflect off the surface of the wafer but, instead, propagates through the wafer. As a result, the efficiency of the reflective sheet is reduced, which in turn, further reduces the ability of the system to accurately measure the temperature of the wafer.

Consequently, the implementation of known emissivity enhancing techniques as described above have good but limited payoffs. This in turn restricts the accuracy with which the true temperature of the wafer can be determined, which in turn limits the performance and accuracy of the wafer processing system.

SUMMARY OF THE INVENTION

The present invention recognizes and addresses the foregoing disadvantages, and others of prior art constructions and methods.

Accordingly, it is an object of the present invention to provide an improved system and process for measuring the temperature of a radiating body without contacting the body.

Another object of the present invention is to provide a method and system for determining the temperature of an object by sensing the thermal radiation emitted by the object at a particular wavelength.

It is another object of the present invention to provide a method and system of determining the temperature of an object by reflecting the thermal radiation being emitted by the object and then measuring the reflected radiation at a plurality of locations including locations of high reflectivity and locations of low reflectivity.

Still another object of the present invention is to provide a system for processing semiconductor wafers that monitors the temperature of the wafer and, based on temperature determinations, controls the amount of heat supplied to the wafer.

It is another object of the present invention to provide a method and system of determining the temperature of a semiconductor wafer while exposing the wafer to light energy.

Another object of the present invention is to provide a method and apparatus for determining the temperature of a semi-transparent radiating body.

It is still another object of the present invention to provide a method and apparatus for determining the temperature of a semiconductor wafer at lower temperatures.

It is another object of the present invention to provide a method and apparatus for determining the temperature of a semiconductor wafer by placing the wafer in between a pair of reflective plates and then measuring the thermal radiation being reflected between the plates at a plurality of locations including locations of high reflectivity and locations of low reflectivity.

These and other objects of the present invention are achieved by providing an apparatus for measuring the temperature of a semi-transparent radiating body. The apparatus includes a chamber adapted to receive a radiating body.

A first reflective device and a second reflective device are contained within the chamber and are positioned such that a radiating body can be placed between both reflective devices. The first and second reflective devices include areas of high reflectivity, which reflect thermal radiation at a selected wavelength that is being emitted by the radiating body. At least one of the reflective devices also includes an area of low reflectivity.

A radiation sensing device senses the thermal radiation being reflected by the reflective devices at the selected wavelength. The radiation sensing device senses the thermal radiation within an area of high reflectivity and within the area of low reflectivity for determining the temperature of the radiating body.

In one embodiment, the apparatus can further include a heat source in communication with the chamber for heating objects contained within the chamber. The heat source can include at least one lamp. The heat source can be separated from the chamber by a filter which substantially prevents light at a preselected wavelength from entering the chamber. The radiation sensing device, which can include a plurality of pyrometers, can be configured to sense thermal radiation at the preselected wavelength.

The apparatus can also include a control system, such as a microprocessor, in communication with the radiation sensing device and with the heat source. The controller can be configured to receive thermal radiation information from the radiation sensing device and, based on this information, to control the amount of heat being emitted by the heat source.

In one embodiment, the first reflective device is positioned between the light energy source and the second reflective device. In this embodiment, the first reflective device is substantially transparent to light energy needed to heat the radiating body while still being capable of reflecting thermal radiation at the operating wavelength. For instance, the first reflective device can be made from a silica plate that is coated on a surface facing the second reflective device with a dielectric coating that has a high reflectivity at the operating wavelength.

The first reflective device can include a first reflective surface facing the second reflective device and the second reflective device can include a second reflective surface facing the first reflective device. The reflective surfaces define areas of high reflectivity having a reflectivity of greater than 0.9 at the selected wavelength. The area of low reflectivity, which is also included on one of the reflective surfaces, on the other hand, has a reflectivity of less than about 0.7 and particularly from about 0.2 to about 0.7 at the selected wavelength. The area of low reflectivity, in most applications, is much smaller in size than the areas of high reflectivity.

In one preferred embodiment of the present invention, both the first reflective device and the second reflective device include areas or zones of low reflectivity. The areas of low reflectivity on the reflective devices can be in vertical alignment meaning that when the reflective devices are placed parallel to each other, the zones of low reflecitvity on the top reflective device match up with the zones of low reflectivity on the bottom reflective device.

The areas of high reflectivity and low reflectivity on the reflective devices can be made according to various methods. For instance, in one embodiment, dielectric films or coatings can be used that are specially designed to reflect thermal radiation at a particular wavelength and at a desired amount.

These and other objects of the present invention are also achieved by providing a method for measuring the temperature of a radiating body, such as a semi-transparent semiconductor wafer. The method includes the steps of positioning a radiating body between a first reflective device and a second reflective device. The reflective devices are configured to reflect thermal radiation at a selected wavelength being emitted by the radiating body. The first and second reflective devices include areas of high reflectivity and at least one of the reflective devices also includes an area of low reflectivity at a selected wavelength.

Thermal radiation being emitted by the radiating body is sensed at the selected wavelength using, for instance, a radiation sensing device such as a pyrometer. The thermal radiation is sensed within the areas of high reflectivity and within the area of low reflectivity for determining the temperature of the radiating body.

Other objects, features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Figure 1:
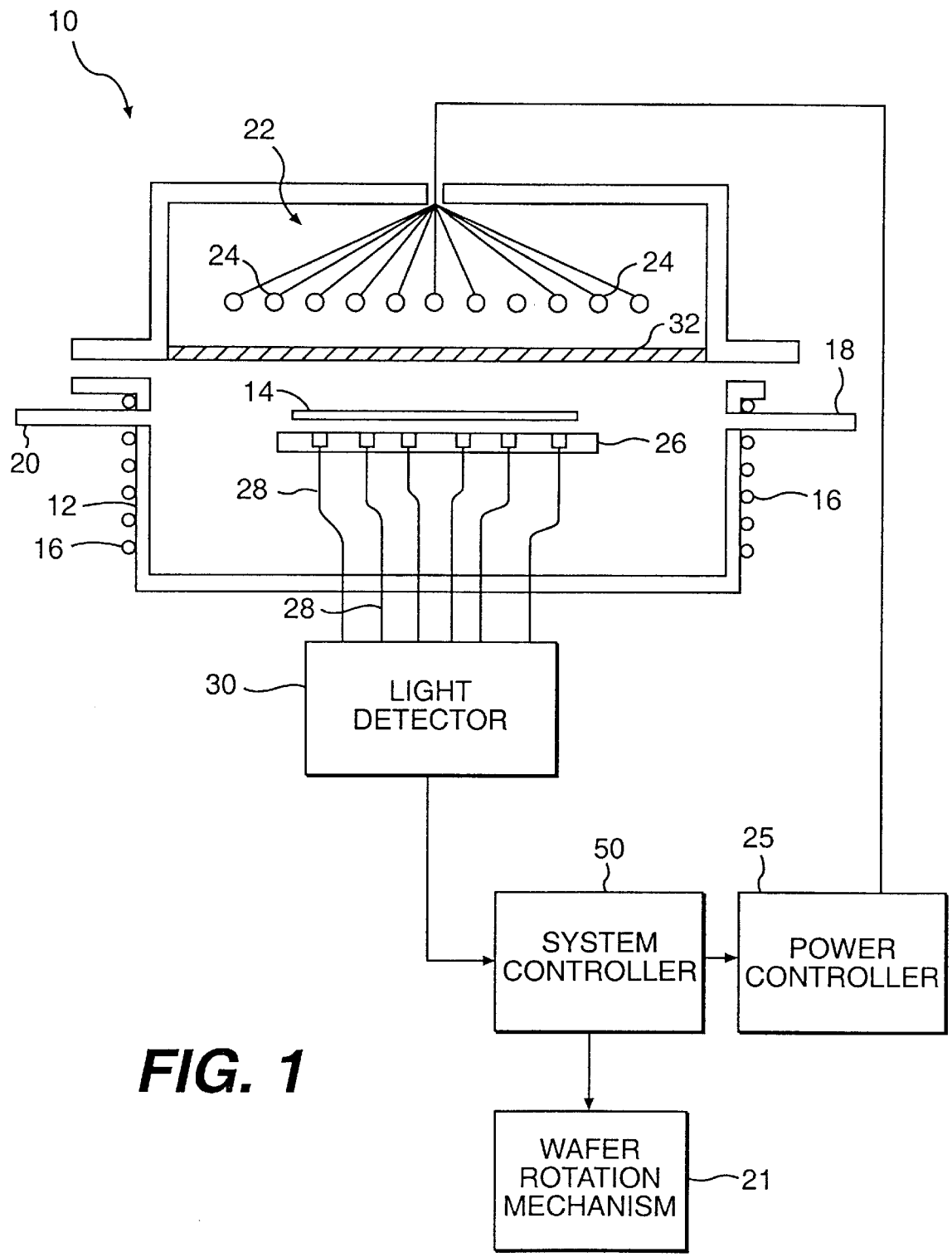
FIG. 1 is a side view of one embodiment of a system for measuring and controlling the temperature of a semiconductor wafer in accordance with the present invention.

Repeat use of reference characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

In general, the present invention is directed to a method and to a system for determining and controlling the temperature of a radiating body. It is believed that the principles of the present invention are applicable to a wide variety of processes contained in different fields. In one embodiment, as will be described hereinafter, the present invention is particularly well suited to determining the temperature of wafers made from a semi-conductive material. Specifically, the system can be used during heat treatment of the wafers, during oxidation of the wafers, or during other processes which modify or add films to the surface of the wafers.

The present invention is generally directed to calculating the temperature of a wafer or object without contacting the wafer or object. The temperature of the object is determined by measuring the thermal radiation being emitted by the object at a particular wavelength. According to the present invention, the emissivity of the object is artificially increased when taking radiation measurements in order to provide more accurate temperature determinations.

More particularly, the present invention is directed to placing a reflective device adjacent to the object, causing radiation emitted by the object to reflect between a surface of the object and the reflective device. As described above, simply using a reflective device, however, provides results that are dependent on the starting emissivity of the surface of the object, on the reflectivity of the reflective device and on the geometry and dimensions of both. To remedy this problem, the present invention is directed to sampling the radiation being emitted by the object in two or more zones where the reflectivity of the reflective device has been modified.

For instance, according to the present invention, the reflective device which is normally highly reflective, includes one or more areas or zones of lower reflectivity. Thermal radiation being emitted by the object is sampled not only in a high reflective area but also in a low reflective area, generating at least two different radiation measurements. By obtaining at least two radiation measurements at areas of high reflectivity and at areas of lower reflectivity, a refinement in the enhancement of the emissivity of the object is achieved for more accurately estimating the temperature of the object.

In an alternative embodiment, the present invention is also directed to calculating the temperature of a semi-transparent radiating body, such as a semiconductor wafer at lower temperatures. In this embodiment, the semiconductor wafer is placed between a first reflective device and a second reflective device which form an optical cavity therebetween. By positioning the wafer between a pair of opposing reflective devices, the radiation emitted by the wafer is caused to reflect multiple times between both of the reflective devices and between the wafer and the reflective devices. One or both of the reflective devices can include not only areas of high reflectivity but also one or more smaller areas of low reflectivity. In order to calculate the temperature of the wafer, thermal radiation is sampled in the highly reflective areas and in the areas of low reflectivity.

Referring to FIG. 1, a system 10 generally made in accordance with the present invention for determining and controlling the temperature of a wafer made from a semiconductive material, such as silicon, is illustrated. System 10 includes a processing chamber 12 adapted to receive substrates such as a wafer 14 for conducting various processes. Chamber 12 is designed to heat wafer 14 at very rapid rates and under carefully controlled conditions. Chamber 12 can be made from various materials, including metals and ceramics. For instance, chamber 12, in one embodiment, can be made from stainless steel.

When chamber 12 is made from a heat conductive material, preferably the chamber includes a cooling system. For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a constant temperature.

Chamber 12 can also include a gas inlet 18 and a gas outlet 20 for introducing a gas into the chamber and/or for maintaining the chamber within a preset pressure range. For instance, a gas can be introduced into chamber 12 through gas inlet 18 for reaction with wafer 14. Once processed, the gas can then be evacuated from the chamber using gas outlet 20.

Alternatively, an inert gas can be fed to chamber 12 through gas inlet 18 for preventing any unwanted or undesirable side reactions from occurring within the chamber. In a further embodiment, gas inlet 18 and gas outlet 20 can be used to pressurize chamber 12. A vacuum can also be created in chamber 12 when desired, using gas outlet 20 or an additional larger outlet positioned beneath the level of the wafer.

During processing, chamber 12, in one embodiment, can be adapted to rotate wafer 14. Rotating the wafer promotes greater temperature uniformity over the surface of the wafer and promotes enhanced contact between wafer 14 and any gases introduced into the chamber. It should be understood, however, that besides wafers, chamber 12 is also adapted to process optical parts, films, fibers, ribbons, and other substrates having any particular shape.

A heat source generally 22 is included in communication with chamber 12 for heating wafer 14 during processing. In this embodiment, heat source 22 includes a plurality of lamps 24, such as tungsten-halogen lamps. Heat source 22 can include a reflector or set of reflectors, for carefully directing thermal energy being emitted by the heat source onto wafer 14 at particular locations. As shown in FIG. 1, lamps 24 are placed above wafer 14. It should be understood, however, that lamps 24 may be placed at any particular location. Further, additional lamps could be included within system 10 if desired.

The use of lamps 24 as heat source 22 is generally preferred. For instance, lamps have much higher heating and cooling rates than other heating devices, such as electrical elements or conventional furnaces. Lamps 24 create a rapid isothermal processing system that provide instantaneous energy, typically requiring a very short and well controlled start up period. The flow of energy from lamps 24 can also be abruptly stopped at any time. As shown in the figure, lamps 24 are equipped with a gradual power controller 25 that can be used to increase or decrease the thermal energy being emitted by the lamps.

In accordance with one embodiment of the present invention, a reflective device 26 is contained within chamber 12 adjacent to wafer 14. Reflective device 26 is connected to a plurality of optical fibers or light pipes 28 which are, in turn, in communication with a light detector 30 as shown in FIG. 1. Alternatively, optical fibers 28 may be connected to a plurality of light detectors. Optical fibers 28 are configured to receive thermal energy being emitted by wafer 14 at a particular wavelength. The amount of sensed radiation is then communicated to light detector 30 which generates a usable voltage signal for determining the temperature of the wafer. In one embodiment, optical fiber 28 in combination with light detector 30 comprises a pyrometer.

Figure 2:
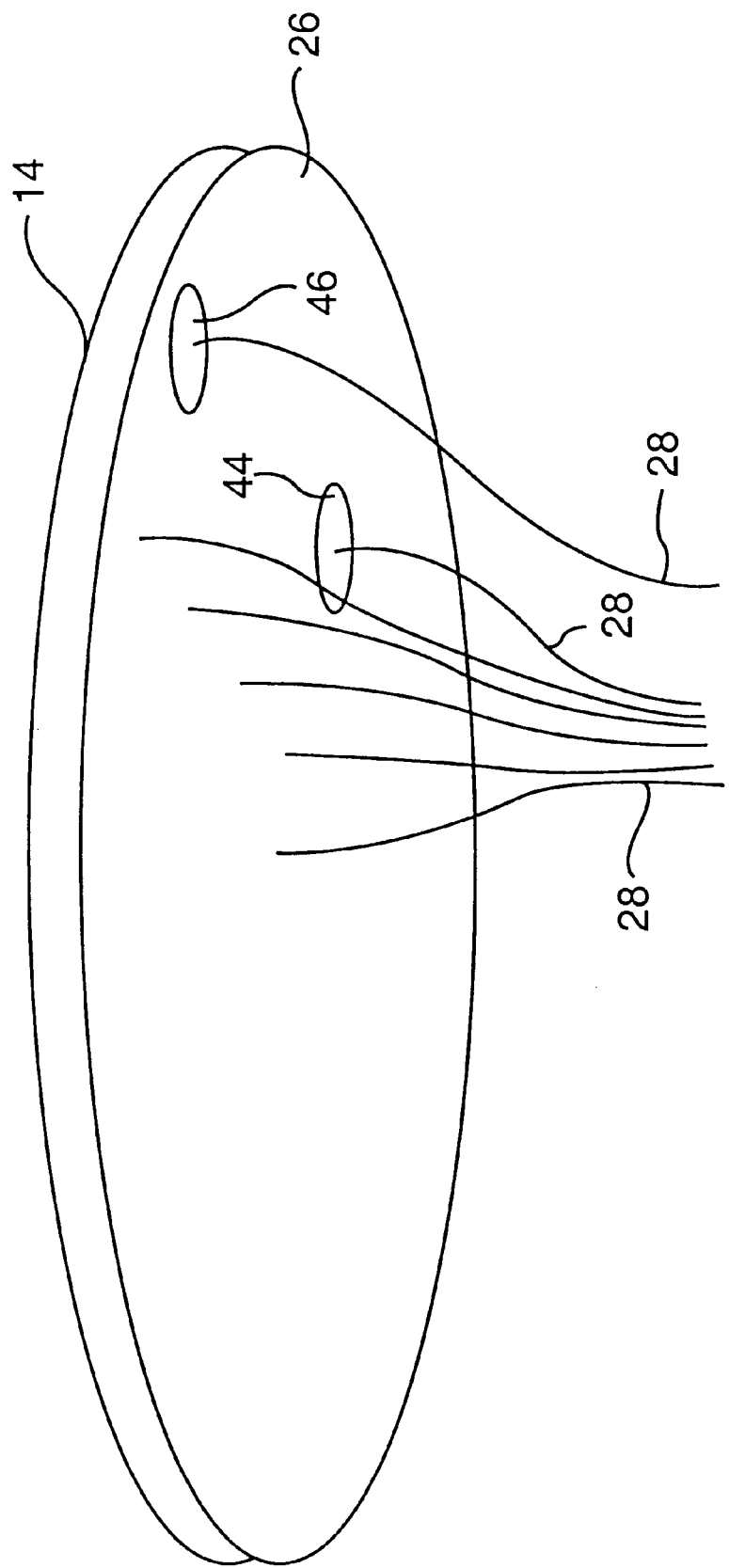
FIG. 2 is a perspective view of a reflective device positioned adjacent to a semiconductor wafer used in determining the temperature of the wafer in accordance with the present invention.
Figure 3:
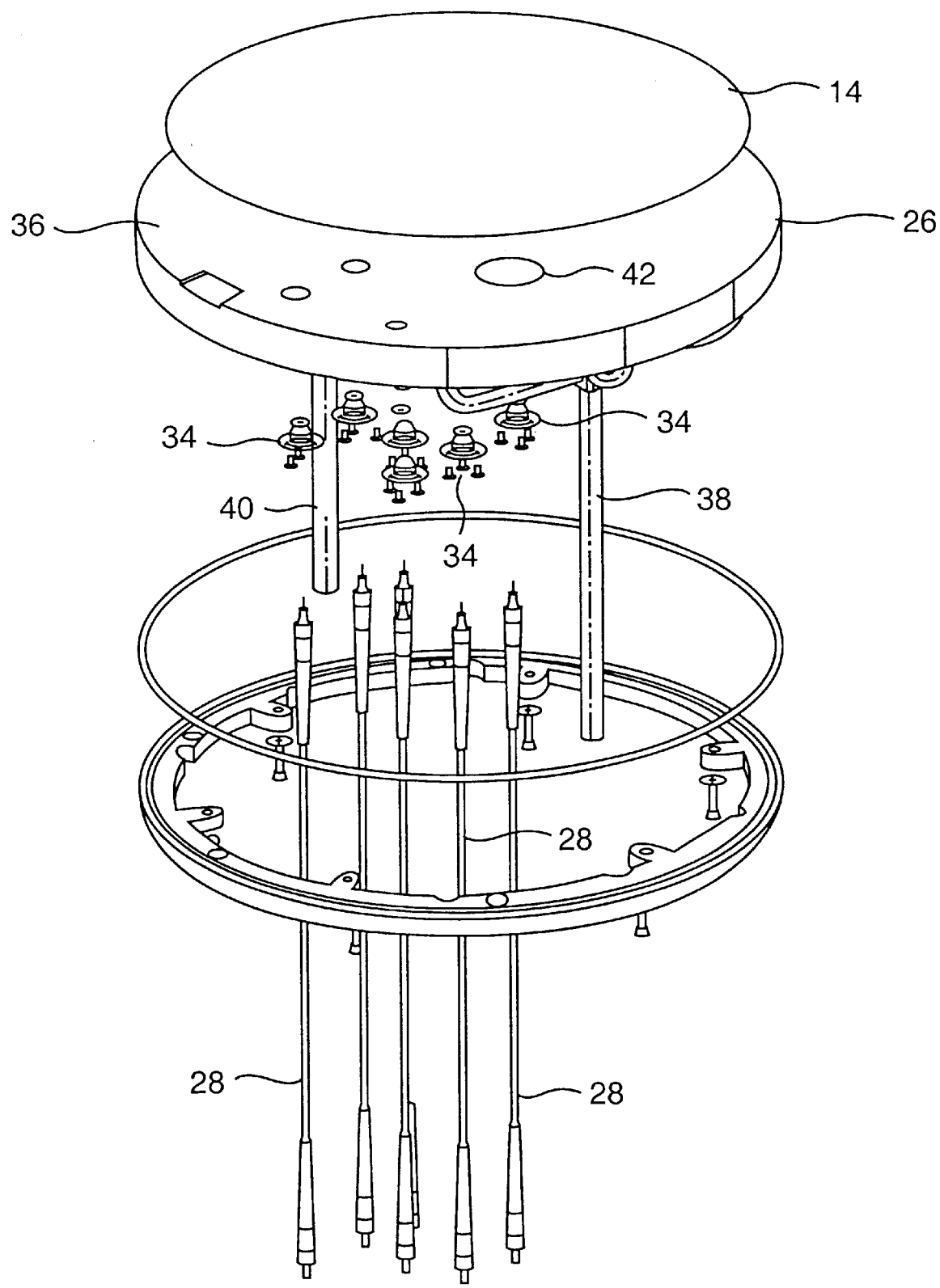
FIG. 3 is a detailed perspective view of a reflective device made in accordance with the present invention shown in combination with a plurality of optical fibers and positioned adjacent to a semiconductor wafer.

Reflective device 26 and optical fibers 28 are more clearly shown in FIGS. 2 and 3. In general, reflective device 26 is designed to reflect the thermal radiation being emitted by wafer 14 at the wavelength at which light detector 30 operates. Reflective device 26 causes the radiation being emitted by wafer 14 to reflect multiple times between a surface of wafer 14 and a surface of reflective device 26. As a result, optical fibers 28 sense more thermal radiation than that which is actually being emitted by the wafer.

During the process of the present invention, system 10 should be designed such that optical fibers 28 only detect thermal radiation being emitted by wafer 14 and not detect radiation being emitted by lamps 24. In this regard, system 10 includes a filter 32 which prevents thermal radiation being emitted by lamps 24 at the wavelength at which light detector 30 operates from entering chamber 12. Filter 32 as shown in FIG. 1 can be a window positioned between chamber 12 and heat source 22. In an alternative embodiment, each lamp 24 can be covered by a separate filter.

In one embodiment, filter 32 is made from fused silica or quartz. Fused silica is known to absorb thermal radiation very effectively at selected wavelengths. For instance, synthetic fused silica is very effective at absorbing light at a wavelength of from approximately 2.7 micrometers to about 2.8 micrometers. Thus, in one embodiment, when filter 32 is made from synthetic fused silica, light detector 30 can be configured to detect thermal radiation being emitted by wafer 14 at a wavelength of about 2.7 micrometers.

Fused silica or fused quartz is also known to be effective at absorbing radiation at wavelengths greater than about 5 micrometers. Operating at a wavelength range of from about 2.7 micrometers to about 2.8 micrometers, however, is preferable. This wavelength range is the shortest wavelength where strong absorption occurs in the silica. Further, silica is most effective within this range, absorbing greater than 95% of the radiation.

As shown in FIG. 3, optical fibers 28 can be connected to reflective device 26 by a coupling 34. Once connected to reflective device 26, optical fibers 28 are positioned on a reflective surface 36 of reflective device 26 for sensing radiation emitted by wafer 14.

In order to cool the reflective device during heat treatment of wafer 14, reflective device 26 includes a cooling fluid inlet 38 and a cooling fluid outlet 40. More particularly, reflective device 26 can include a hollow cavity in communication with inlet 38 and outlet 40 into which a cooling fluid, such as water, can be circulated. In some applications, it is necessary to cool reflective device 26 in order to prevent the reflective device from becoming damaged or from interfering with the heat treating process.

In general, reflective surface 36 should be placed as close as possible to wafer 14 in order to increase the amount that the thermal radiation being emitted by the wafer is reflected. Since reflective device 26 is typically at a lower temperature than wafer 14, however, placing the reflective device too close to the wafer may interfere with the heating process or may prevent the wafer from being heated at a uniform rate. The choice of the distance or spacing between wafer 14 and reflective device 26 depends upon the size of wafer 14. For wafers measuring 200 mm in diameter, in general reflective device 26 can be spaced from about 3 mm to about 15 mm from wafer 14. More particularly, for this wafer size, reflective device 26 is typically spaced from wafer 14 a distance of from about 6 mm to about 8 mm. A larger degree of spacing may be preferable for larger wafers.

As described above, reflective surface 36 of reflective device 26 generally has a very high reflectivity, preferably greater than 0.9 at the wavelength at which radiation is sampled by optical fibers 28 and light detector 30. In accordance with the present invention, reflective device 26 further includes at least one area or zone of lower reflectivity which is used to more accurately determine the temperature of wafer 14. As shown in FIG. 3, reflective device 26, in this embodiment, includes an area 42 having a lower reflectivity than the remainder of reflective surface 36. In FIG. 2, on the other hand, reflective device 26 includes a first area 44 and a second area 46 of lower reflectivity. In this embodiment, area 46 is positioned towards the edge of reflective device 26 while area 44 is positioned midway between the center and the edge of the reflective device.

According to the method of the present invention, optical fibers 28 and light detector 30 sample the radiation being emitted by wafer 14 not only within areas of high reflectivity of reflective surface 36 but also within the areas of lower reflectivity such as at 42 in FIG. 3 and at 44 and 46 as shown in FIG. 2. The signals generated by light detector 30 at the various locations are then analyzed electronically and a correction is computed. The correction is based on an analysis of the optical characteristics of the reflector within areas of high reflectivity, within areas of low reflectivity, and of the wafer itself. The result of the correction is that the inherent emissivity of the wafer has a very minor influence on the corrected readings. The method is also insensitive to small temperature differences in the wafer at the locations where the readings are taken. Ultimately, the method provides for fast, accurate and reproducible temperature measurements of the wafer.

When taking radiation measurements of a wafer or object at different locations and at different reflectivities according to the present invention, the following represents one manner in which the temperature of the wafer can be calculated. It should be understood, however, that it is believed that other mathematical algorithms may exist which may also lead to accurate temperature determinations using the method of the present invention.

According to equation four (4) provided above, the following represents the radiation emitted by a wafer when a reflective surface is placed adjacent to the wafer:

$$R_w = R_{bb}\left(\frac{1-\rho_w}{1-\rho_r\rho_w}\right) \quad (6)$$

In the present invention a further measurement of the radiation being emitted by the wafer is also taken at an area of low reflectivity. This measurement can be labeled $R_a$ and can be stated as follows:

$$R_a = R_{bb}\left(\frac{1-\rho_w}{1-\rho_a\rho_w}\right) \quad (7)$$

wherein $\rho_a$ represents the lower reflectivity.

As stated above, according to Kirchhoff's law, $\rho_w = 1-E$. Substituting this equation into equations 6 and 7 above gives:

$$R_w = R_{bb}\frac{E}{1-(1-R)\rho_r} \quad (8)$$

$$R_a = R_{bb}\frac{E}{1-(1-E)\rho_a} \quad (9)$$

Dividing the radiation sampled in the area of low reflectivity with the radiation sampled in the area of high reflectivity gives the following, assuming that the reflectivity $\rho_r$ is equal to 1:

$$\frac{R_a}{R_w} = \frac{E}{1-(1-E)\rho_a} \quad (10)$$

If the emissivity (E) is solved for in the above equation, the following result is obtained:

$$E_x = \frac{\frac{R_a}{R_w}(1-\rho_a)}{1-\frac{R_a}{R_w}\rho_a} \quad (11)$$

wherein the emissivity is labeled $E_x$ in order to show that it is an approximation.

From the above equation, a correction factor can be derived. In particular, the correction factor is a factor to be multiplied by the radiation that is measured in the highly reflective area of the reflective device. The correction factor is a factor that improves the ability to determine the temperature of the wafer by minimizing emissivity dependence. The correction factor in this embodiment is as follows:

$$\frac{1-\rho_{eff}(1-E_x)}{E_x} \quad (12)$$

wherein $\rho_{eff}$ is the reflectivity of the reflective device that minimizes the emissivity dependence of the corrected radiation to be calculated from actual radiation readings. In most applications, $\rho_{eff}$ will have a value very close to the value of the reflectivity of the reflective device in the highly reflective area. The value of $\rho_{eff}$ is affected, however, by the presence of a gap between the wafer and reflective device, and by the distance from a particular optical fiber to the edge of the wafer or to the edge of the reflective device.

From equation 12 above, the corrected radiation is as follows:

$$R_{cor} = \frac{1 - \rho_{eff}(1 - E_x)}{E_x} R_w \qquad (13)$$

wherein $R_{cor}$ is the corrected radiation signal calculated from the radiation measured in the highly reflective areas ($R_w$). Making use of the value for $E_x$ as stated in equation 11 above, the following result can be obtained:

$$R_{corr} = \left[ \frac{1 - \dfrac{1 - \rho_{eff}}{1 - \rho_a}}{1 - \dfrac{1 - \rho_{eff}}{1 - \rho_a} \times \dfrac{R_w}{R_a}} \right] R_w \qquad (14)$$

Examining the correction factor in brackets above, it can be seen that the correction factor depends on the ratio of $(1-\rho_{eff})$ to $(1-\rho_a)$. Consequently, in the derived algorithm above, there will not be a unique solution covering all applications for $\rho_{eff}$ and for $\rho_a$. Further, $\rho_a$ will need to be estimated in order to account for some interference radiation that will be sensed in the areas of low reflectivity that originates from areas of high reflectivity. There will be, however, a particular solution for any $\rho_{eff}$ and $\rho_a$ which has the same ratio $(1-\rho_{eff})/(1-\rho_a)$ that produces a least square fit.

In other words, according to the solution derived above, the system will need to be calibrated for the particular application. For instance, if the system of the present invention were to process silicon wafers, data can first be obtained from a few wafers having known properties. These data can then be incorporated into equation 14 in order to approximate the variables $\rho_{eff}$ and $\rho_a$ using a least square fit method. Once these variables are then determined, the system will be capable of accurately determining the temperature of other wafers having similar properties. Thus far, it has been found that this calibration step can be completed using initially as few as four (4) wafers with widely varying values of emissivity.

Referring back to FIG. 1, as shown, system 10 further includes a system controller 50 which can be, for instance, a microprocessor. Controller 50 receives voltage signals from light detector 30 that represent the radiation amounts being sampled at the various locations. Based on the signals received from light detector 30, controller 50 is configured to calculate the temperature of wafer 14 based on the above mathematical relationships.

System controller 50 as shown in FIG. 1 can also be in communication with lamp power controller 25. In this arrangement, controller 50 can calculate the temperature of wafer 14, and, based on the calculated information, control the amount of thermal energy being emitted by lamps 24. In this manner, instantaneous adjustments can be made regarding the conditions within reactor 12 for processing wafer 14 within carefully controlled limits.

In one embodiment, controller 50 can also be used to automatically control other elements within the system. For instance, controller 50 can be used to control the flow rate of gases entering chamber 12 through gas inlet 18. As shown, controller 50 can further be used to control the rate at which wafer 14 is rotated within the chamber.

Referring to FIGS. 2 and 3, the construction of reflective device 26 and specifically of reflective surface 36 will now be discussed. According to the present invention, as described above, reflective surface 36 is highly reflective, preferably having a reflectivity greater than 0.9, at the wavelength at which optical fiber 28 and light detector 30 operate. Reflective surface 36, however, also includes zones or areas of reduced reflectivity such as indicated at 44 and 46 in FIG. 2. In general, the reflectivity within areas 44 and 46 should be less than 0.9 and can be, for instance, between about 0.2 to about 0.7. More particularly, thus far, good results have been obtained when the reflectivity within areas 44 and 46 is from about 0.3 to about 0.5 at the wavelength of interest.

The size and the amount of zones or areas of lower reflectivity located on reflective device 26 will depend upon the particular application. In general, the temperature of wafer 14 can be estimated more precisely the greater the number of zones or areas appearing on reflective device 26. The zones or areas of lower reflectivity, however, may interfere with the heating process of the wafer. In particular, the zones or areas may lower the temperature of the wafer at adjacent locations. Thus, the size and amount of the zones of lower reflectivity should be controlled to prevent such adverse interference.

In one preferred embodiment, as illustrated in FIG. 2, reflective device 26 includes two areas 44 and 46 of lower reflectivity. Further, when using a reflective device having approximately a 10 inch diameter, areas 44 and 46 can have, in this embodiment, a diameter of from about 1 inch to about 2 inches.

Reflective surface 36 of reflective device 26 can be made from various materials. In one preferred embodiment, reflective surface 36 is formed by coating a metallic substrate, such as stainless steel, with a dielectric film. The dielectric film can be a multi-layer optical film specially designed to have the appropriate reflectivity at the desired wavelength. Such films are known in the art and can be obtained from Deposition Sciences, Inc. of Santa Rosa, Calif.

Besides dielectric films, reflective surface 36 can also be made from highly polished metals coated with a clear protective coating, such as a clear dielectric coating. Such metals include gold, silver, and nickel. However, for a particular desired wavelength, metal surfaces are typically not as reflective as the dielectric films described above. Also, the metals may cause contamination within processing chamber 12 when heated to high temperatures.

The zones or areas of lower reflectivity appearing on reflective surface 36 can also be created according to numerous methods. For instance, in one embodiment, when reflective surface 36 is made from a dielectric film, areas 44 and 46 can also be made from a dielectric film. In particular, the dielectric film used to construct areas 44 and 46 can have a lower reflectivity than the dielectric film used to construct reflective surface 36.

In an alternative embodiment, holes or openings can be carved into reflective surface 36 for creating the areas of lower reflectivity. The openings may go all the way through reflective device 26 or may, alternatively, for instance, be carved into a dielectric film exposing the substrate underneath.

For example, in one embodiment, reflective surface 36 can be constructed by coating a stainless steel substrate with a multi-layer dielectric film. The areas of low reflectivity may then be formed into the surface by carving openings into the multi-layer film and exposing the stainless steel substrate underneath.

Although placing openings within reflective device 26 is very effective at providing areas of lower reflectivity, such openings may interfere with the heating process of wafer 14. For instance, such openings may have a greater tendency to create lower temperature areas on the wafer than if the lower reflectivity areas were created by a separate film or composition on the reflective surface.

In a further alternative embodiment, the areas of lower reflectivity located on reflective surface 36 can be created by mirrors that only partially transmit radiation therethrough. Such mirrors could be placed above reflective surface 36. More particularly, a mirror could be positioned such that the radiation reflected off the mirror would be sent to a remote location within the chamber, while the radiation filtering through the mirror would be focused upon a small area on reflective surface 36. If desired, in this embodiment, the mirror could rotate with wafer 14 or could be configured to move to different locations below wafer 14 for lowering the reflectivity upon reflective surface 36 within different areas.

The above described embodiments as illustrated in FIGS. 1–3 containing a single reflective device 26 are particularly well adapted for calculating the temperature of radiating bodies that are opaque at the wavelength of interest. Such embodiments, however, may not be as well suited for calculating the temperature of a radiating body that is semi-transparent at the wavelength at which the thermal radiation is sampled. In particular, it is known that most semiconductor wafers, such as silicon wafers, are semi-transparent to thermal radiation at wavelengths of greater than about 1.2 microns at lower temperatures, such as at less than about 700° C.

The ability to measure the temperature of semi-transparent semiconductor wafers is becoming increasingly more important. In particular, current wafer processing chambers are required to process wafers at temperatures lower than 700° C. Consequently, there is increasing demand to be able to more accurately calculate and measure the temperature of wafers during these processes.

In this regard, the present invention is also directed to a method and apparatus for measuring the temperature of a semi-transparent radiating body. In this embodiment, besides emissivity, the transparency of the radiating body must be accounted for.

Figure 4:
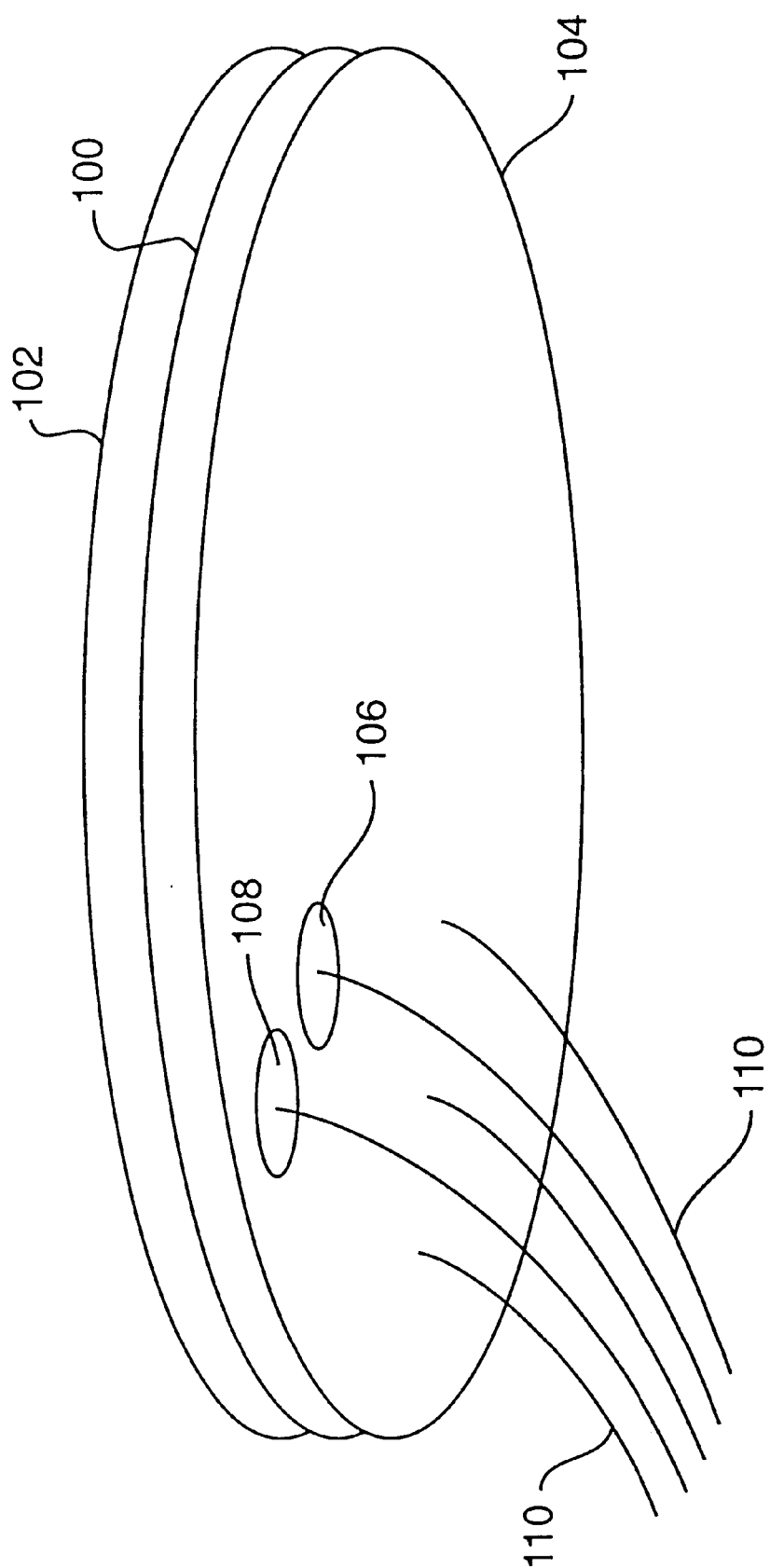
FIG. 4 is a perspective view of a semiconductor wafer positioned between a first reflective device and a second reflective device in accordance with the present invention which are used in determining the temperature of the wafer at temperatures at which the wafer is semi-transparent.

In this embodiment of the present invention, in order to account for transparency, the semiconductor wafer is placed in between a pair of parallel reflective devices or plates as illustrated in FIG. 4. As shown, a semiconductor wafer 100 is placed between a first reflective device 102 and a second reflective device 104. Reflective devices 102 and 104 are opaque and highly reflective at the wavelength at which the radiation sensing device operates. Reflective devices 102 and 104 form an optical cavity and cause the radiation emitted by semiconductor wafer 100 to reflect multiple times. In particular, reflected thermal radiation that passes through semiconductor wafer 100 due to the transparency of the wafer is not permitted to escape but instead is contained within the optical cavity formed by reflective devices 102 and 104.

If the two reflective devices are in close proximity to semiconductor wafer 100, the two devices cause the multiple reflected radiation being emitted by the wafer to add up and approximate the radiation of a perfect black body at the temperature of the wafer. This has the effect of enhancing the emissivity of the wafer to a value close to unity, even though the wafer is semi-transparent. By enhancing the emissivity of the wafer to a value close to unity and by minimizing the effects of the transparency of the wafer, the temperature of the wafer can be more accurately calculated.

The following mathematical equations demonstrate the enhancements that are achieved when using two spaced apart reflective devices as opposed to one when attempting to calculate the temperature of a semi-transparent radiating body.

As was derived above, when using a single reflective device to measure the radiation emitted by an opaque wafer, the following equation resulted:

$$R_w = R_{bb}\left(\frac{1-\rho_w}{1-\rho_r\rho_w}\right) \tag{4}$$

wherein $\rho_w$ is the reflectivity of the wafer and $\rho_r$ is the reflectivity of the reflective device. Since the emissivity of the wafer (E) plus the reflectivity of the wafer equals 1, the above equation can be written as:

$$R_w = R_{bb}\frac{E}{1-\rho_r(1-E)} \tag{15}$$

When the wafer is semi-transparent, such as at lower temperatures, the transmittance of the wafer ($\tau$) must be taken into account. Specifically, when the wafer is semi-transparent the following relationship occurs:

$$E+\rho_w+\tau=1 \tag{16}$$

Due to the above relationship, equation number 4 above converts to the following when the wafer is semi-transparent and when a single reflective device is placed adjacent to one side of the wafer:

$$R_w = R_{bb}\frac{E}{1-\rho_r[1-(E-\tau)]} \tag{17}$$

As shown by the above equation, in this embodiment, even if the reflectivity of the reflective device ($\rho_r$) is equal to 1, a factor of E/(E+$\tau$) remains in the equation. Thus, using only a single reflective device to calculate the temperature of a semi-transparent wafer may not always give completely accurate results especially if the transmittance component is high.

Adding a second reflective device, however, compensates to some extent for the transparency of the wafer. As described above, when using two reflective devices, thermal radiation being emitted by the wafer is contained between the two devices and is reflected multiple times. If it is assumed that the reflectivity ($\rho_r$) of both reflective devices are equal and that the emissivity of the front side of the wafer and of the backside of the wafer are equal, then the following equation can be derived:

$$R_w = R_{bb}\frac{E}{1-\rho_r(\rho_w+\tau)} \tag{18}$$

Since $\rho_w+\tau=1-E$, equation 18 can also be expressed as follows:

$$R_w = R_{bb}\frac{E}{1-\rho_r(1-E)} \tag{19}$$

which is identical to equation number 15 above when using a single reflective device adjacent to an opaque wafer. It should be noted, however, that when the wafer is semi-transparent, the emissivity of the wafer is relatively smaller than the emissivity of an opaque wafer due to the effect of the transparency.

From the above equation, if all conditions are ideal and the reflectivity of both reflective devices is 100%, then the above equation reduces to $$R_w = R_{bb} \quad (20)$$

Thus, ideally, using a pair of parallel reflective devices corrects for both the emissivity and the transparency of the wafer. This result, however, assumes not only that the reflectivity of the reflective devices is 100% but that the reflective devices have an infinite length and are positioned infinitesimally close to the wafer.

In a real situation, however, the reflectivity of the reflective devices is less than 100%, the reflective devices have a finite area and the reflective devices must be spaced up to several millimeters from the wafer. All of these factors contribute to deviations in the calculated temperature from the true temperature of the wafer. Ultimately, the ability to accurately measure the temperature of the wafer remains dependent upon the emissivity of the wafer and the transparency of the wafer.

Thus, in order to further compensate for the emissivity and transparency of the wafer, according to the present invention, as shown in FIG. 4, at least one of reflective devices 102 and 104 contains zones of lower reflectivity, such as at 106 and 108. As also shown, a plurality of light pipes 110 are connected to reflective device 104 for sampling thermal radiation in areas of high reflectivity and in the areas of low reflectivity on the surface of reflective device 104.

Thus, two types of radiation signals are generated including those in the areas of high reflectivity and those in the areas of low reflectivity. By comparing these signals, it is possible to compensate for the emissivity and transparency of the wafer in calculating the wafer temperature. This is accomplished by analyzing the signals and then computing a correction factor. The correction is based on an analysis of the optical characteristics of the highly reflective zones, of the low reflective zones, and of the wafer. The result of calculating a correction factor is that the inherent emissivity of the wafer and the transparency of the wafer have a very minor influence on the corrected readings. The method is also insensitive to small temperature differences in the wafer at the locations where the readings are taken. Ultimately, the method provides for fast, accurate and reproducible temperature measurements of a semi-transparent wafer.

More particularly, the correction factor (designated herein as "C") is calculated according to the ratio between a high $E_{\mathit{eff}}$ low $\tau_{\mathit{eff}}$ signal and a low $E_{\mathit{eff}}$ high $\tau_{\mathit{eff}}$ signal, which can be stated as the ratio of a signal using a single reflective device to a signal using a pair of opposing reflective devices. In essence, sampling thermal radiation in the areas of low reflectivity as shown in FIG. 4 equates to sampling thermal radiation in a system that only contains a single reflective device. This ratio can be used to minimize the effect of the emissivity and the transparency of the wafer in calculating a corrected radiation signal which can then be equated to a temperature measurement.

In one embodiment, an equation that can be used to calculate the correction factor (C) is as follows:

$$R_{cor} = \frac{1-C}{1-C\frac{R_H}{R_L}} R_H \quad (21)$$

wherein $R_H$ is the thermal radiation sensed in the areas of high reflectivity, $R_L$ is the thermal radiation sensed in areas of low reflectivity and $R_{cor}$ is the corrected radiation signal.

The correction factor (C) will need to be calibrated for the particular application. The correction factor is found by searching for the numerical value that minimizes the differences of $R_{cor}$ for different wafers with different emissivities and transparencies. For instance, the correction factor can be calculated by first obtaining data from a few wafers having known properties.

It should be appreciated, however, that since the transparency of most semiconductor wafers is dependent upon the temperature, the correction factor will vary as the temperature of the wafer is changed. Thus, different correction factors may need to be calculated over a broad temperature range.

Reflective devices 102 and 104 as shown in FIG. 4 should be totally opaque and highly reflective of thermal radiation at the measurement wavelength. Reflective devices 102 and 104 can be constructed similar to reflective device 26 described above. For instance, reflective device 104 can include a polished metal surface or can include a substrate coated with a dielectric film. Low reflective areas 108 and 106 can be produced by creating holes in the surface of the reflective device or can be made by placing on the reflective device a dielectric material having desired reflectivity characteristics.

Figure 5:
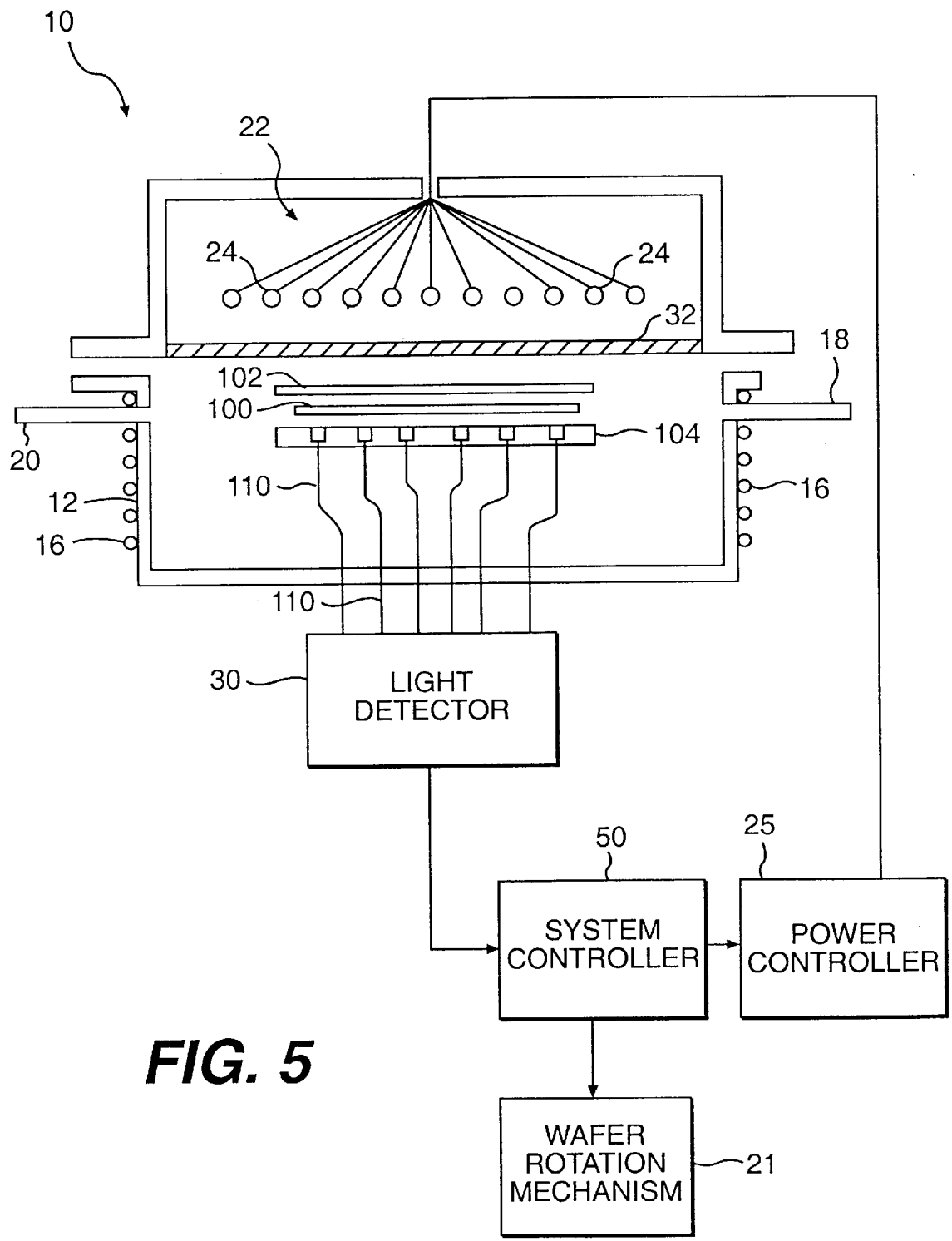
FIG. 5 is a side view of the embodiment of FIG. 4.

In the embodiment illustrated in FIG. 4 and FIG. 5, reflective device 102 is positioned between the light energy source used to heat the wafer and the wafer itself. Thus, reflective device 102 should include a surface that is highly reflective to thermal radiation at the wavelength of interest but should otherwise be transparent in order for the wafer to be heated. For instance, in one embodiment, reflective device 102 can be made from a silica plate that is coated on the surface facing the wafer with a dielectric film that is highly reflective at the operating wavelength such as, for instance, at 2.7 microns.

In general, the reflectivity of reflective device 102 and of reflective device 104 should be greater than about 0.9 at the wavelength of interest. The reflectivity in areas 106 and 108, however, should be less than about 0.7, and particularly from about 0.2 to about 0.7.

The number, the size and the location of the low reflective areas or zones on each of the reflective devices will depend upon the particular application. In general, the temperature of wafer 100 can be estimated more precisely the greater the number of low reflective areas or zones. As described above, however, the low reflective areas may interfere with the heating process of the wafer by lowering the temperature of the wafer at locations adjacent to the low reflective areas.

In most applications, the low reflective areas should be much smaller in size in comparison to the total surface area of the reflective device. The low reflective areas can appear only on reflective device 104, only on reflective device 102, or on both reflective devices. When the low reflective areas are located on both reflective devices, the low reflective areas can be staggered with respect to each other or can be aligned.

In one preferred embodiment of the present invention, each of the reflective devices contain at least two low reflective areas. Further, it has been found that the best results have been obtained when the low reflective areas are aligned with respect to each other. In other words, the best results have been obtained when a low reflective area appearing on the upper reflective device is aligned with a low reflective area appearing on the lower reflective device.

Similar to the embodiment illustrated in FIG. 1, light pipes 110 as shown in FIG. 4 and FIG. 5 can be connected to a light detector, such as one or more pyrometers. The pyrometers, in turn, can be connected to a system controller. The controller can receive thermal radiation signals from the light detector, calculate the temperature of the wafer, and then automatically control the amount of energy being emitted from the light energy source for heating the wafer according to a predesigned temperature regime.

The present invention may be better understood with reference to the following examples.

EXAMPLE NO. 1

The following test was performed in order to demonstrate the effectiveness of the process of the present invention in determining the temperature of a substantially opaque semi-conductive wafer.

Four (4) silicon wafers with known emissivities were placed in a thermal processing chamber and heated. Within the thermal processing chamber, each wafer was placed adjacent to a reflective plate. The reflective plate was made from a stainless steel substrate that was coated on a surface adjacent the wafer with dielectric films. In particular, a large area of the surface of the stainless steel substrate was coated with a highly reflective dielectric film having an apparent reflectivity of approximately 97% for light at a wavelength of about 2.7 microns.

In accordance with the present invention, the surface of the reflective plate also included a small zone having a lower reflectivity. The low reflective zone, which had a diameter of approximately 1 inch, was made from a second dielectric film. The dielectric film used to make the low reflective zone had a reflectivity of approximately 30% to 40% for light at a wavelength of about 2.7 microns.

Once each wafer was placed in the thermal processing chamber, the true temperature of the wafer was monitored with a thermocouple. Each of the wafers was heated to a temperature of 823° C. While at this temperature, a first pyrometer sensed the thermal radiation being emitted by the wafer in the highly reflective region on the reflective plate. A second pyrometer monitored the thermal radiation being emitted by the wafer within the low reflective zone. Each pyrometer sensed thermal radiation at a wavelength of about 2.7 microns.

Using the thermal radiation data produced by the pyrometers, the temperature of each wafer was calculated. Specifically, first the temperature of each wafer was calculated using the thermal radiation data sensed by the first pyrometer using conventional methods. The temperature of the wafer was then also calculated according to the process of the present invention as described above using not only the thermal radiation data collected within the highly reflective region but also collected within the low reflective region.

The following results were obtained:

TABLE 1

Calculated Temperatures of Wafers Heated to 823° C.

| Wafer | Emissivity | Temperature Deviation From the True Temperature | |
|---|---|---|---|
| | | Using 1st Pyrometer | Using 1st and 2nd Pyrometers |
| 1 | 0.22 | −32 | −1.0 |
| 2 | 0.39 | −17 | 1.0 |
| 3 | 0.55 | −11 | 1.5 |
| 4 | 0.94 | −3 | −1.3 |

As shown above, the process of the present invention provided dramatic improvements in the ability to accurately determine the temperature of a heated wafer in comparison to conventional methods. Specifically, the temperature of a heated substrate can be much more accurately determined by sampling thermal radiation in regions of high reflectivity and low reflectivity than only sampling thermal radiation within areas of high reflectivity.

EXAMPLE NO. 2

The following tests were performed in order to demonstrate the effectiveness of the process of the present invention in also determining the temperature of semi-transparent semiconductor wafers.

Four silicon wafers with known emissivities were placed in a thermal processing chamber and heated. Within the thermal processing chamber, each wafer was placed in between a top reflective plate and a bottom reflective plate. The bottom reflective plate was made from a stainless steel substrate that was coated on a surface adjacent the wafer with dielectric films. In particular, a large area of the surface of the stainless steel substrate was coated with a highly reflective dielectric film having an apparent reflectivity of approximately 97% for light at a wavelength of about 2.7 microns.

In accordance with the present invention, the surface of the bottom reflective plate also included a small zone having a low reflectivity. The low reflective zone which had a diameter of approximately one inch, was made from a second dielectric film. The dielectric film used to make the low reflective zone had a reflecitvity of approximately 30% to 40% for light at a wavelength of about 2.7 microns.

During the experiment, two different top reflective plates were used. The first top reflective plate was made from silica that was coated with a dielectric film on a surface adjacent the wafer. The dielectric film had an apparent reflectivity of approximately 97% for light at a wavelength of about 2.7 microns.

The second top reflective plate was also made from silica and was also coated with the dielectric film having the high reflectivity. The second top reflective plate, however, also included a small zone having a low reflectivity. The low reflective zone was positioned on the top reflective plate so as to be in direct alignment with the low reflective zone contained on the bottom reflective plate. The low reflective zone on the second top reflective plate was made using a dielectric film having a reflectivity of approximately 30% to about 40% for light at a wavelength of about 2.7 microns.

Each of the four wafers was placed in a thermal processing chamber and heated. The true temperature of the wafer was monitored with a thermocouple. Each of the wafers was heated to a temperature of 350° C., 400° C., 450° C., and 500° C. While at these temperatures, a first pyrometer sensed the radiation being emitted by the wafer in the highly reflective region on the bottom reflective plate. A second pyrometer monitored the thermal radiation being emitted by the wafer within the low reflective zone on the bottom reflective plate. Each pyrometer sensed thermal radiation at a wavelength of about 2.7 microns.

Each of the wafers was heated to the above temperatures twice. In the first set of experiments, the first top reflective plate was used, while in a second set of tests, the second top reflective plate was used.

In each set of tests, the data generated by each of the first three wafers heated was used to calculate a correction factor as described above for a semi-transparent wafer. Once the correction factor was determined, the temperature of each wafer was calculated. A comparison was made between the accuracy of the temperature measurements using the first top reflective plate and using the second top reflective plate. The following results were obtained:

TABLE 2

Calculated Temperatures of Wafers Heated to 350° C.

| Wafer | Emissivity | ΔT Using Low Reflective Zone on Bottom Plate | ΔT Using Aligned Reflective Zones on Top and Bottom Plates |
|---|---|---|---|
| 1 | 0.87 | 0 | 0 |
| 2 | 0.68 | −24.0 | −2.9 |

TABLE 2-continued

Calculated Temperatures of Wafers Heated to 350° C.

| Wafer | Emissivity | ΔT Using Low Reflective Zone on Bottom Plate | ΔT Using Aligned Reflective Zones on Top and Bottom Plates |
|---|---|---|---|
| 3 | 0.27 | −7.3 | −15.2 |
| 4 | 0.43 | −7.8 | −12.2 |

TABLE 3

Calculated Temperature of Wafers Heated to 400° C.

| Wafer | Emissivity | ΔT Using Low Reflective Zone on Bottom Plate | ΔT Using Aligned Reflective Zones on Top and Bottom Plates |
|---|---|---|---|
| 1 | 0.87 | 0 | 0 |
| 2 | 0.68 | −20.1 | 0.6 |
| 3 | 0.27 | −11.5 | −8.4 |
| 4 | 0.43 | −9.3 | −7.3 |

TABLE 4

Calculated Temperature of Wafers Heated to 450° C.

| Wafer | Emissivity | ΔT Using Low Reflective Zone on Bottom Plate | ΔT Using Aligned Reflective Zones on Top and Bottom Plates |
|---|---|---|---|
| 1 | 0.87 | 0 | 0 |
| 2 | 0.43 | −7.8 | −3.5 |
| 3 | 0.27 | −7.3 | −0.1 |
| 4 | 0.68 | −15.1 | 1.7 |

TABLE 5

Calculated Temperature of Wafers Heated to 500° C.

| Wafer | Emissivity | ΔT Using Low Reflective Zone on Bottom Plate | ΔT Using Aligned Reflective Zones on Top and Bottom Plates |
|---|---|---|---|
| 1 | 0.87 | 0 | 0 |
| 2 | 0.43 | 6.0 | −4.1 |
| 3 | 0.27 | 2.6 | 0.3 |
| 4 | 0.68 | −10.8 | −1.1 |

From the above-tables, the ΔT refers to the deviation of the calculated temperature from the true temperature of the wafer. In both sets of experiments, relatively accurate temperatures were calculated for the wafers. In fact, it is believed that the above calculated temperatures are more accurate than if the temperatures were calculated using only a single reflective device. Also, as shown above, generally speaking better results were obtained when using two reflective devices that each contain a low reflective area in alignment with each other.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method for measuring the temperature of a semi-transparent radiating body comprising the steps of:
    positioning a semi-transparent radiating body between a first reflective device and a second reflective device, said radiating body having an emissivity value and a transmittance value, said first and second reflective devices being configured to reflect thermal radiation at a selected wavelength being emitted by said radiating body, said first and second reflective devices including areas of high reflectivity, said first reflective device also including an area of low reflectivity at said selected wavelength;
    sensing the thermal radiation being emitted by said radiating body at said selected wavelength, said thermal radiation being sensed within said area of high reflectivity and within said area of low reflectivity on said first reflective device; and
    calculating a temperature of said radiating body from said thermal radiation being sensed within said area of high reflectivity and within said area of low reflectivity, said temperature being calculated from a mathematical model that compensates for the emissivity and the transparency of the radiating body.

2. A method as defined in claim 1, wherein said area of low reflectivity is smaller in size in relation to said area of high reflectivity.

3. A method as defined in claim 2, wherein said area of high reflectivity has a reflectivity of greater than 0.9 at said selected wavelength, while said area of low reflectivity has a reflectivity of from about 0.2 to about 0.7 at said selected wavelength.

4. A method as defined in claim 3, wherein said second reflective device also includes an area of low reflectivity at said selected wavelength, said area of low reflectivity being the same size as and in alignment with said area of low reflectivity on said first reflective device.

5. A method as defined in claim 2, wherein said first reflective device includes a plurality of areas of low reflectivity, said thermal radiation being sensed within each of said areas of low reflectivity.

6. A method as defined in claim 5, wherein said area of high reflectivity surrounds said areas of low reflectivity.

7. A method as defined in claim 1, wherein said temperature of said radiating body is calculated by calculating a correction factor, said correction factor being based upon a ratio of said thermal radiation being sensed within said area of high reflectivity to said thermal radiation being sensed within said area of low reflectivity.

8. A method for measuring the temperature of a semi-transparent radiating body comprising the steps of:
    positioning a semi-transparent radiating body between a first reflective device and a second reflective device, said radiating body having an emissivity value and a transmittance value, said first and second reflective devices being configured to reflect thermal radiation at a selected wavelength being emitted by said radiating body;
    sensing the thermal radiation being emitted and reflected by said radiating body at said selected wavelength between said first and second reflective devices; and
    calculating a temperature of said radiating body from said thermal radiation being sensed between said reflective devices, said temperature being calculated from a mathematical model that compensates for the emissivity and the transparency of the radiating body.

* * * * *